(12) United States Patent
Chae et al.

(10) Patent No.: US 9,590,144 B2
(45) Date of Patent: Mar. 7, 2017

(54) LIGHT EMITTING DEVICE HAVING WIDE BEAM ANGLE AND METHOD OF FABRICATING THE SAME

(71) Applicant: Seoul Viosys Co., Ltd., Ansan-si (KR)

(72) Inventors: Jong Hyeon Chae, Ansan-si (KR); Chung Hoon Lee, Ansan-si (KR); Daewoong Suh, Ansan-si (KR); Jong Min Jang, Ansan-si (KR); Joon Sup Lee, Ansan-si (KR); Won Young Roh, Ansan-si (KR); Min Woo Kang, Ansan-si (KR); Hyun A Kim, Ansan-si (KR); Seon Min Bae, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/139,875

(22) Filed: Apr. 27, 2016

(65) Prior Publication Data
US 2016/0240743 A1 Aug. 18, 2016

Related U.S. Application Data

(62) Division of application No. 14/807,290, filed on Jul. 23, 2015, now Pat. No. 9,356,198, which is a division
(Continued)

(30) Foreign Application Priority Data

Sep. 26, 2013 (KR) .......... 10-2013-0114735
Sep. 30, 2013 (KR) .......... 10-2013-0116630

(51) Int. Cl.
*H01L 27/15* (2006.01)
*H01L 31/12* (2006.01)
(Continued)

(52) U.S. Cl.
CPC ............ *H01L 33/44* (2013.01); *H01L 33/005* (2013.01); *H01L 33/007* (2013.01); *H01L 33/08* (2013.01); *H01L 33/20* (2013.01); *H01L 33/387* (2013.01); *H01L 27/153* (2013.01); *H01L 33/405* (2013.01); *H01L 2933/0025* (2013.01)

(58) Field of Classification Search
CPC ......... H01L 33/00; H01L 33/08; H01L 33/26; H01L 51/00; H01L 51/0032
See application file for complete search history.

(56) References Cited

U.S. PATENT DOCUMENTS

2010/0118408 A1* 5/2010 Lee .......................... G02B 5/02
359/599
2010/0213488 A1 8/2010 Choi et al.
(Continued)

OTHER PUBLICATIONS

Non-Final Office Action issued on May 29, 2015, in U.S. Appl. No. 14/496,895.
(Continued)

*Primary Examiner* — Hoai V Pham
(74) *Attorney, Agent, or Firm* — H.C. Park & Associates, PLC

(57) ABSTRACT

A light emitting device including a light emitting structure disposed on one surface of a substrate and a transflective portion disposed on the other surface of the substrate. The transflective portion and the substrate have different indexes of refraction from one another.

9 Claims, 9 Drawing Sheets

Related U.S. Application Data of application No. 14/496,895, filed on Sep. 25, 2014, now Pat. No. 9,123,866.

(51) Int. Cl.
| | |
|---|---|
| *H01L 33/00* | (2010.01) |
| *H01L 33/44* | (2010.01) |
| *H01L 33/08* | (2010.01) |
| *H01L 33/20* | (2010.01) |
| *H01L 33/38* | (2010.01) |
| *H01L 33/40* | (2010.01) |

(56) References Cited

U.S. PATENT DOCUMENTS

| | | |
|---|---|---|
| 2015/0028457 A1 | 1/2015 | Shikauchi et al. |
| 2016/0056351 A1 | 2/2016 | Yang et al. |

OTHER PUBLICATIONS

Notice of Allowance issued on Jun. 22, 2015, in U.S. Appl. No. 14/496,895.

Notice of Allowance issued on Apr. 19, 2016, in U.S. Appl. No. 14/807,290.

\* cited by examiner

LIGHT EMITTING DEVICE HAVING WIDE BEAM ANGLE AND METHOD OF FABRICATING THE SAME

CROSS-REFERENCE TO RELATED APPLICATIONS

This application is a Divisional of U.S. patent application Ser. No. 14/807,290, filed on Jul. 23, 2015, which is a Divisional of U.S. patent application Ser. No. 14/496,895, filed on Sep. 25, 2014, now U.S. Pat. No. 9,123,866, and claims priority from and the benefit of Korean Patent Application No. 10-2013-0114735 and Korean Patent Application No. 10-2013-0116630, filed on Sep. 26, 2013, and Sep. 30, 2013, respectively, all of which are hereby incorporated by reference for all purposes as if fully set forth herein.

BACKGROUND

Field

Exemplary embodiments of the present invention relate to a technology for a light emitting device and a method of fabricating the same, including a light emitting device having a wide beam angle by virtue of surface treatment and the like, and a method of fabricating the same.

Discussion of the Background

Light emitting devices are inorganic semiconductor devices emitting light generated by recombination of electrons and holes, and are used in a variety of fields such as displays, vehicle lamps, general lighting devices, and the like. Since nitride semiconductors, such as a gallium nitride semiconductor and a gallium aluminum semiconductor, may be of a direct transition type and may be fabricated to have various energy band gaps, the nitride semiconductors may be used to fabricate light emitting devices having various wavelength emission ranges as needed.

Light emitting devices are required to have various ranges of beam angles depending upon applications thereof. For example, it is advantageous that UV light emitting devices applied to backlight units of displays, sterilizers, and the like have wide beam angles. Therefore, additional components such as a lens, or a technique such as surface treatment are used to increase beam angles of the light emitting devices.

For wafer level packages having no separate package body, or chip-on-board type light emitting devices, it is necessary to adjust beam angles thereof without an additional component, such as a lens. However, although typical surface processing techniques can increase light extraction efficiency of light emitting devices, there is difficulty in increasing the beam angles thereof. Particularly, since it is undesirable that an injection-molded component or lens made of a material, which can be deformed or degraded by UV light, be applied to UV light emitting devices, there is a limit in application of techniques for increasing beam angles.

In addition, typical flip chip type light emitting devices have a problem in that even a sapphire substrate having a thickness of 400 μm or greater has difficulty in realizing a wide beam angle of 140° or more, and that, as the thickness of the sapphire substrate increases, luminous efficiency decreases.

Therefore, there is a need for techniques for increasing a beam angle of a light emitting device not employing a package body or a lens.

SUMMARY

Exemplary embodiments of the present invention provide light emitting devices having a wide beam angle and methods of fabricating the same.

Exemplary embodiments also provide a light emitting device having a wide beam angle without the need for an additional component such as a lens, and a method of fabricating the same.

Exemplary embodiments also provide a light emitting device which includes a thin sapphire substrate and a transflective layer formed on the sapphire substrate to minimize light loss so as to improve luminous efficiency while achieving a wide beam angle of 140° or more.

Additional features of the invention will be set forth in the description which follows, and in part will be apparent from the description, or may be learned by practice of the invention.

An exemplary embodiment of the present invention discloses a light emitting device including: a light emitting structure; a substrate disposed on the light emitting structure; and an anti-reflection layer covering side surfaces of the light emitting structure and the substrate, wherein at least a portion of an upper surface of the substrate is exposed.

An exemplary embodiment of the present invention also discloses a method of fabricating a light emitting device including: preparing a light emitting structure on which a substrate is formed; and forming an anti-reflection layer covering side surfaces of the light emitting structure and the substrate, wherein at least a portion of an upper surface of the substrate is exposed.

An exemplary embodiment of the present invention also discloses a light emitting device including: a substrate; a light emitting structure formed on one surface of the substrate; and a transflective portion formed on the other surface of the substrate, wherein the transflective portion may have a different index of refraction from that of the substrate.

DETAILED DESCRIPTION OF THE ILLUSTRATED EMBODIMENTS

Figure 1:
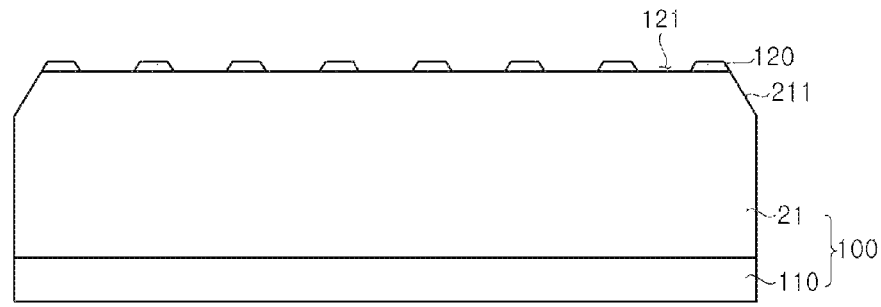
FIGS. 1, 2, 3, and 4 are sectional views of an example of a light emitting device according to an exemplary embodiment of the present invention, and a method of fabricating the same.

Hereinafter, exemplary embodiments of the disclosed technology will be described in detail with reference to implementation examples, including those illustrated in the accompanying drawings. The following exemplary embodiments are provided by way of examples so as to convey the disclosed technology to those skilled in the art to which the present invention pertains. Accordingly, the present invention is not limited to the exemplary embodiments disclosed herein and can be implemented in different forms. In the drawings, widths, lengths, thicknesses, and the like of elements may be exaggerated for convenience and illustrative purposes. Further, when an element is referred to as being "above" or "on" another element, it can be "directly above" or "directly on" the other element or intervening elements may be present. It will be understood that for the purposes of this disclosure, "at least one of X, Y, and Z" can be construed as X only, Y only, Z only, or any combination of two or more items X, Y, and Z (e.g., XYZ, XYY, YZ, ZZ). Throughout drawings and corresponding description in the specification, like reference numerals denote like elements having the same or similar functions.

FIGS. 1 to 4 are sectional views of an exemplary of a light emitting device according to one embodiment of the disclosed technology and a method of fabricating the same.

Referring to FIG. 1, a mask pattern 120 is formed on a light emitting diode 100.

The light emitting diode 100 may include a light emitting structure 110 and a substrate 21 disposed on the light emitting structure 110. The light emitting device may further include electrodes (not shown) disposed under the light emitting structure 110. Accordingly, the light emitting structure 110 may be used as a wafer level package without packaging. Any structure capable of emitting light with semiconductor layers may be used as the light emitting structure 110 without limitation, and the light emitting structure 110 may have, for example, a flip-chip structure or a vertical type structure. Next, one example of the light emitting diode 100 will be described with reference to FIGS. 12 to 16. However, it should be understood that the disclosed technology is not limited thereto, and a structure of the light emitting diode 100 described below is provided to aid in comprehension of the disclosed technology.

FIGS. 12(a) to 16(b) are views showing a light emitting diode 100 according to one exemplary embodiment of the present invention, and a method of fabricating the same, where FIGS. 12(a), 13(a), 14(a), 15(a), and 16(a) are plan views, and FIGS. 12(b), 13(b), 14(b), 15(b), and 16(b) are sectional views taken along line A-A shown in the plan views, respectively.

Figure 12A:
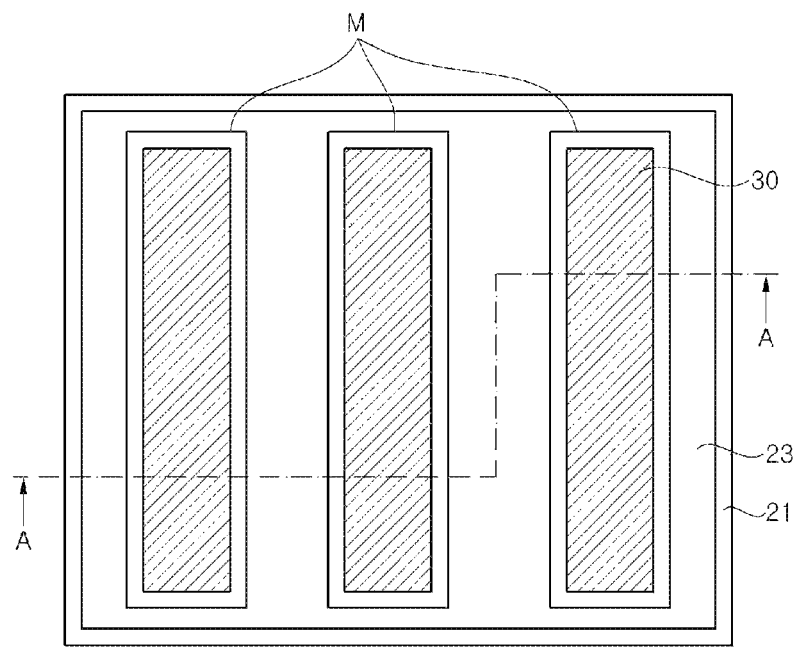
FIGS. 12(a), 12(b), 13(a), 13(b), 14(a), 14(b), 15(a), 15(b), 16(a), and 16(b) are sectional views and plan views of an example of a light emitting diode according to an exemplary embodiment of the present invention.
Figure 12B:
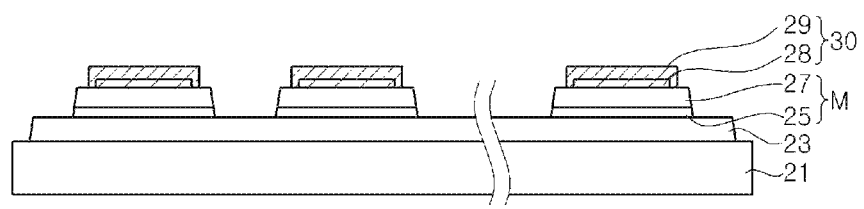

First, referring to FIGS. 12(a) and 12(b), a first conductive type semiconductor layer 23 is formed on a substrate 21, and a plurality of mesas M separated from each other are formed on the first conductive type semiconductor layer 23. Each of the mesas M includes an active layer 25 and a second conductive type semiconductor layer 27. The active layer 25 is interposed between the first conductive type semiconductor layer 23 and the second conductive type semiconductor layer 27. A reflective electrode 30 is disposed on each of the mesas M.

The mesas M may be formed by growing an epitaxial layer including the first conductive type semiconductor layer 23, the active layer 25, and the second conductive type semiconductor layer 27, on the substrate 21 by metal organic chemical vapor deposition (MOCVD), or the like, followed by patterning the second conductive type semiconductor layer 27 and the active layer 25 to expose the first conductive type semiconductor layer 23. Side surfaces of the mesas M may be obliquely formed by photo-resist reflow or other techniques. An inclined profile of the side surfaces of the mesas M enhances extraction efficiency of light generated in the active layer 25.

Figure 8:
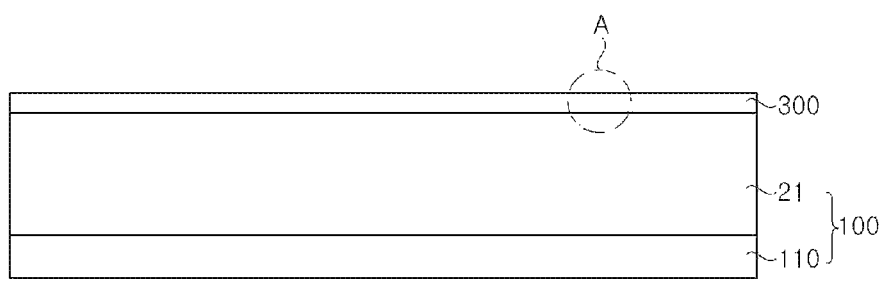
FIG. 8 is a sectional view of an example of a light emitting device according to another exemplary embodiment of the present invention.

The mesas M may each have an elongated shape and extend parallel to each other in one direction, as shown in FIG. 8. Such a shape simplifies formation of the plural mesas M each having the same shape in a plurality of chip regions of the substrate 21.

However, it should be understood that the disclosed technology is not limited thereto, and thus, instead of a plurality of mesas, a single mesa may be formed. If the light emitting diode 100 includes a single mesa, a region exposing the first conductive type semiconductor layer 23 may be formed in other areas, except for a region of the mesa. The region exposing the first conductive type semiconductor layer 23 may be formed with various shapes, for example, one or more holes passing through the single mesa.

Although the reflective electrodes 30 may be formed on the respective mesas M after formation of the mesas M, it should be understood that the disclosed technology is not limited thereto. Alternatively, after the second conductive type semiconductor layer 27 is formed, the reflective electrodes 30 may be formed on the second conductive type semiconductor layer 27 before formation of the mesa M. The reflective electrodes 30 cover most of an upper surface of the mesas M and have substantially the same shape as that of the mesas M in plan view.

The reflective electrodes 30 include a reflective layer 28 and may further include a barrier layer 29. The barrier layer 29 may cover an upper surface and side surfaces of the reflective layer 28. For example, a pattern of the reflective layer 28 is formed and then the barrier layer 29 is formed thereon, whereby the barrier layer 29 may be formed to cover the upper surface and the side surfaces of the reflective layer 28. By way of example, the reflective layer 28 may be formed by depositing Ag, Ag alloys, Ni/Ag, NiZn/Ag, or TiO/Ag, followed by patterning. The barrier layer 29 may be formed of, or include Ni, Cr, Ti, Pt, or a composite layer thereof, and prevents diffusion or contamination of metallic material in the reflective layer.

After the mesas M are formed, an edge of the first conductive type semiconductor layer 23 may also be subjected to etching. As a result, an upper surface of the substrate 21 may be exposed. A side surface of the first conductive type semiconductor layer 23 may also be formed at an angle.

As shown in FIG. 1, the mesas M may be restrictively disposed within an upper region of the first conductive type semiconductor layer 23. That is, the mesas M may be disposed in an island shape on the upper region of the first conductive type semiconductor layer 23.

Figure 13A:
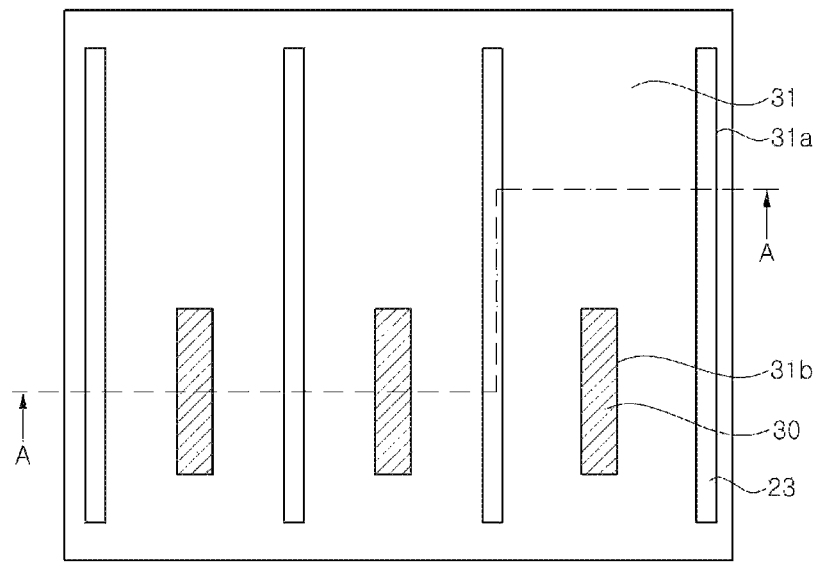
Figure 13B:
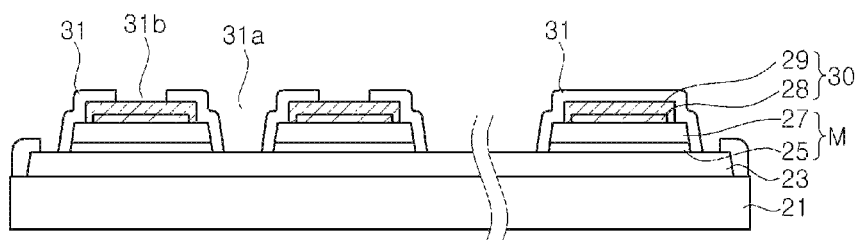

Referring to FIGS. 13(a) and 13(b), a lower insulation layer 31 is formed to cover the mesas M and the first conductive type semiconductor layer 23. The lower insulation layer 31 has openings 31a, 31b in specific regions thereof to allow electrical connection to the first conductive type semiconductor layer 23 and the second conductive type semiconductor layer 27. For example, the lower insulation layer 31 may have openings 31a that expose the first conductive type semiconductor layer 23 and openings 31b that expose the reflective electrodes 30.

The openings 31a may be disposed between the mesas M and near an edge of the substrate 21, and may have an elongated shape extending along the mesas M. In addition, the openings 31b are restrictively disposed on the mesas M to be biased to the same ends of the mesas.

The lower insulation layer 31 may be formed of, or include an oxide film of $SiO_2$, a nitride film of $SiN_X$, or an insulation film of $MgF_2$ by chemical vapor deposition (CVD), electron-beam evaporation, or the like. Although the lower insulation layer 31 may include a single layer, the lower insulation layer 31 may also include multiple layers. In addition, the lower insulation layer 31 may be formed of, or include a distributed Bragg reflector (DBR), in which low and high index of refraction material layers are alternately stacked one above another. For example, an insulation reflective layer having high reflectivity may be formed by stacking $SiO_2/TiO_2$ or $SiO_2/Nb_2O_5$ layers.

Figure 14A:
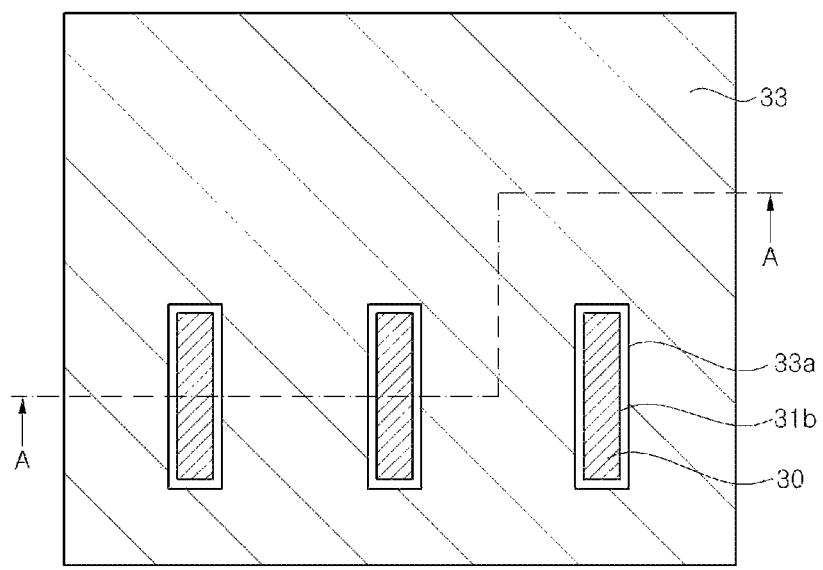
Figure 14B:
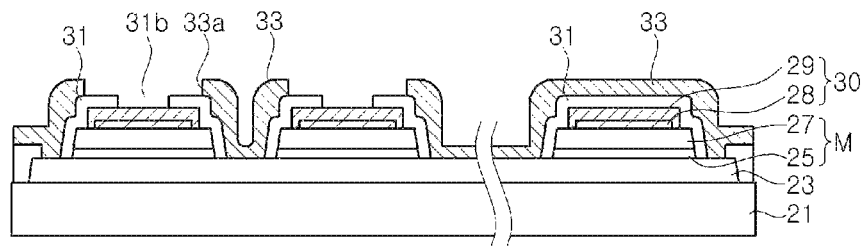

Referring to FIGS. 14(a) and 14(b), a current spreading layer 33 is formed on the lower insulation layer 31. The current spreading layer 33 covers the mesas M and the first conductive type semiconductor layer 23. The current spreading layer 33 has openings 33a disposed above the respective mesas M such that the reflective electrodes are exposed therethrough. The current spreading layer 33 may form ohmic contact with the first conductive type semiconductor layer 23 through the openings 31a of the lower insulation layer 31. The current spreading layer 33 is insulated from the mesas M and the reflective electrodes 30 by the lower insulation layer 31.

The openings 33a of the current spreading layer 33 have a larger area than the openings 31b of the lower insulation layer 31 so as to prevent the current spreading layer 33 from contacting the reflective electrodes 30. Accordingly, sidewalls of the openings 33a are disposed on the lower insulation layer 31.

The current spreading layer 33 is formed over a substantially overall upper area of the substrate 21 excluding the openings 33a. Accordingly, current can be easily dispersed through the current spreading layer 33. The current spreading layer 33 may include a highly reflective metal layer, such as an Al layer, and the highly reflective metal layer may be formed on a bonding layer, such as Ti, Cr, Ni or the like. Further, a protective layer having a monolayer or composite layer structure of Ni, Cr or Au may be formed on the highly reflective metal layer. The current spreading layer 33 may have a multilayer structure of, for example, Ti/Al/Ti/Ni/Au.

Figure 15A:
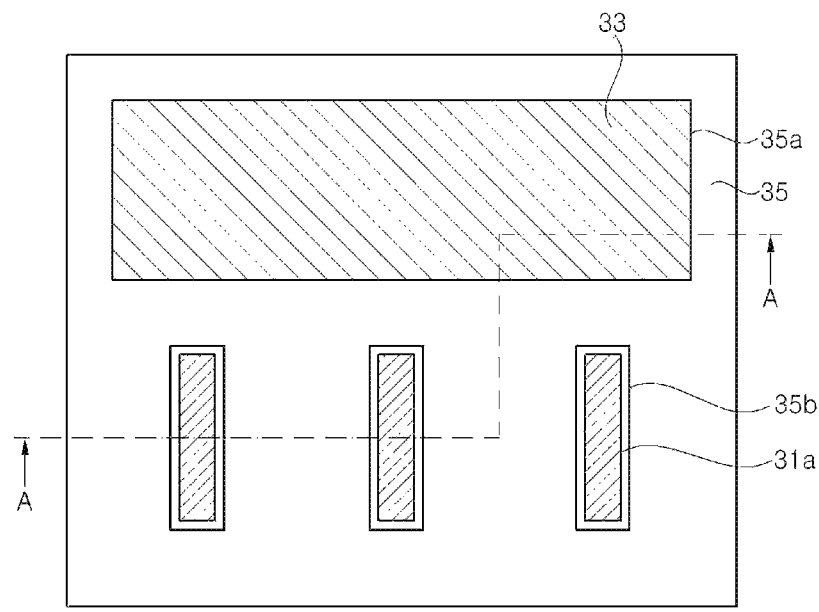
Figure 15B:
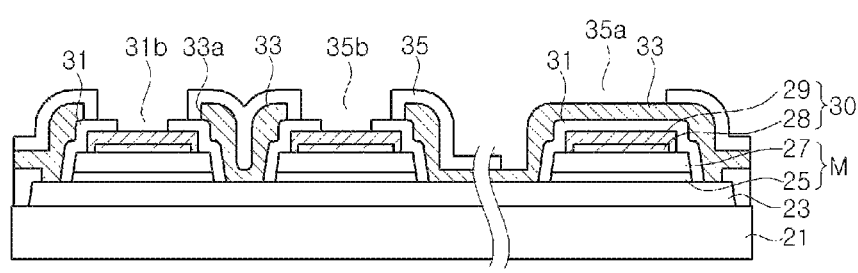

Referring to FIGS. 15(a) and 15(b), an upper insulation layer 35 is formed on the current spreading layer 33. The upper insulation layer 35 has openings 35b that expose the reflective electrodes 30 together with an opening 35a that exposes the current spreading layer 33. The opening 35a may have an elongated shape aligned in a direction perpendicular to a longitudinal direction of the mesas M, and may have a larger area than the openings 35b. The openings 35b expose the reflective electrodes 30 exposed through the openings 33a of the current spreading layer 33 and the openings 31b of the lower insulation layer 31. The openings 35b may have a smaller area than the openings 33a of the current spreading layer 33 but a larger area than the openings 31b of the lower insulation layer 31. Accordingly, sidewalls of the openings 33a of the current spreading layer 33 may be covered with the upper insulation layer 35.

The upper insulation layer 35 may be formed using an oxide insulation layer, a nitride insulation layer, or a polymer such as polyimide, Teflon, Parylene, or the like.

Figure 16A:
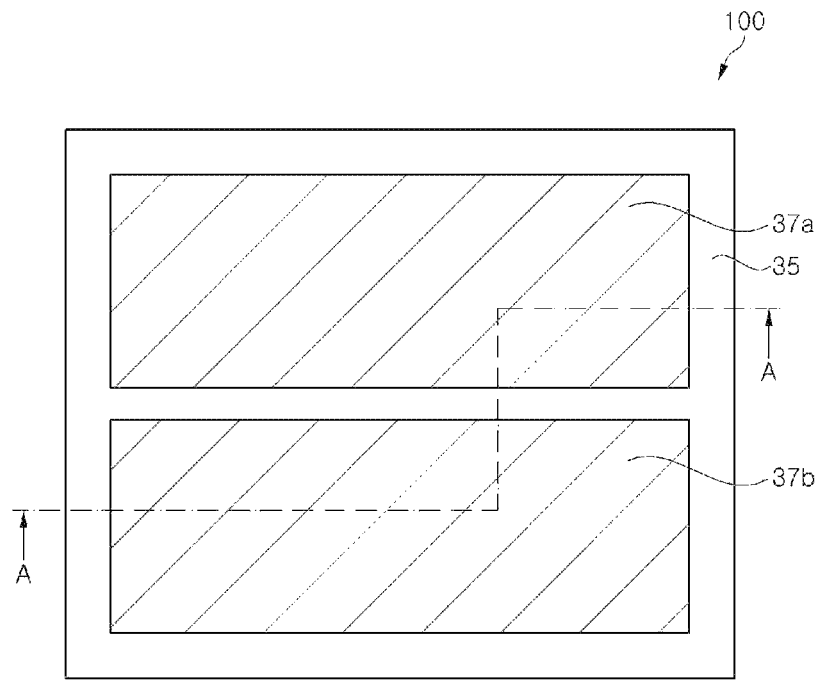
Figure 16B:
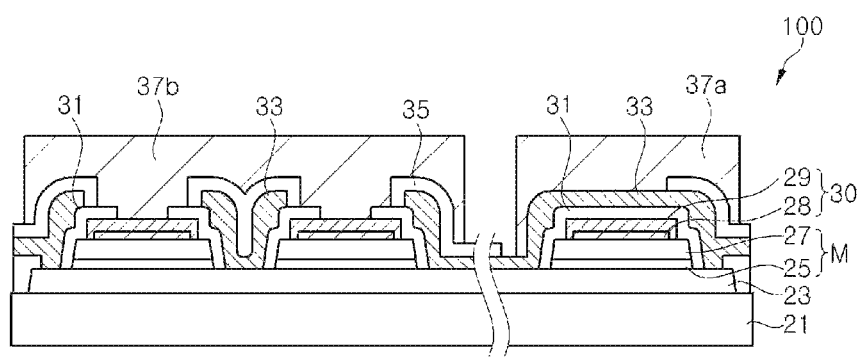

Referring to FIGS. 16(a) and 16(b), a first pad 37a and a second pad 37b are formed on the upper insulation layer 35. The first pad 37a is connected to the current spreading layer 33 through the opening 35a of the upper insulation layer 35, and the second pad 37b is connected to the reflective electrodes 30 through the openings 35b of the upper insulation layer 35. The first and second pads 37a, 37b may be used as pads for connection of bumps for mounting the light emitting diode on a sub-mount, a package, or a printed circuit board, or pads for surface mount technology (SMT).

The first and second pads 37a, 37b may be formed simultaneously by the same process, for example, a photolithography and etching process or a lift-off process. The first and second pads 37a, 37b may include a bonding layer formed of, or include, for example, Ti, Cr, Ni, and the like, and a high conductivity metal layer formed of, or include Al, Cu, Ag, Au, and the like.

Then, the substrate 21 is divided into individual light emitting diode chip units, thereby providing finished light emitting diode chips. At this time, the substrate 21 may be divided by scribing, such as laser scribing. If the substrate 21 is divided by laser scribing, a chamfered surface may be formed at an upper corner of the substrate 21. The chamfered surface may have an inclined side surface. Although not shown in FIG. 16(b), the chamfered surface 211 may be formed at an upper corner of the substrate 21, as shown in FIG. 1.

Hereinafter, the structure of the light emitting diode 100 according to the present exemplary embodiment will be described in detail with reference to FIGS. 16(a) and 16(b).

The light emitting diode may include the first conductive type semiconductor layer 23, the mesas M, the reflective electrodes 30, the current spreading layer 33, the substrate 21, the lower insulation layer 31, the upper insulation layer 35, and the first and second pads 37a, 37b.

The substrate 21 may be a growth substrate for growth of gallium nitride epitaxial layers, for example, a sapphire substrate, a silicon carbide substrate, a silicon substrate, or a gallium nitride substrate. In this embodiment, the substrate 21 may be a sapphire substrate.

The first conductive type semiconductor layer 23 is continuous, and the plural mesas M are disposed to be separated from each other on the first conductive type semiconductor layer 23. As illustrated with reference to FIG. 12(b), the mesas M include the active layer 25 and the second conductive type semiconductor 27 and have an elongated shape extending toward one side. Here, the mesas M are a laminate structure of gallium nitride compound semiconductor layers. As shown in FIG. 12(b), the mesas M may be restrictively disposed within the upper region of the first conductive type semiconductor layer 23.

The first conductive type semiconductor layer 23, the active layer 25, and the second conductive type semiconductor layer 27 may include nitride semiconductors. The first and second conductive type semiconductor layers 23, 27 may be n-type and p-type semiconductor layers, respectively, or vice versa. The active layer 25 may include a nitride semiconductor, and a peak wavelength of light emitted from the active layer 25 may be determined by adjusting a composition ratio of the nitride semiconductor. Particularly, in this exemplary embodiment, the active layer 25 may emit light having a peak wavelength in a UV band.

The reflective electrodes 30 are respectively disposed on the mesas M to form ohmic contact with the second conductive type semiconductor layer 27. As illustrated with reference to FIG. 1, the reflective electrodes 300 may include the reflective layer 28 and the barrier layer 29, and the barrier layer 29 may cover the upper surface and the side surfaces of the reflective layer 28.

The current spreading layer 33 covers the mesas M and the first conductive type semiconductor layer 23. The current spreading layer 33 has the openings 33a disposed above the respective mesas M such that the reflective electrodes 30 are exposed therethrough. The current spreading layer 33 also forms ohmic contact with the first conductive type semiconductor layer 23 and is insulated from the plural mesas M. The current spreading layer 33 may include a reflective metal such as Al.

The current spreading layer 33 may be insulated from the mesas M by the lower insulation layer 31. For example, the lower insulation layer 31 may be interposed between the mesas M and the current spreading layer 33 to insulate the current spreading layer 33 from the mesas M. In addition, the lower insulation layer 31 may have the openings 31b disposed within the upper regions of the respective mesas M such that the reflective electrodes 30 are exposed therethrough, and the openings 31a that expose the first conductive type semiconductor layer 23 therethrough. The current spreading layer 33 may be connected to the first conductive type semiconductor layer 23 through the openings 31a of the lower insulation layer 31. The openings 31b of the lower insulation layer 31 have a smaller area than the openings 33a of the current spreading layer 33, and are all exposed through the openings 33a.

The upper insulation layer 35 covers at least a portion of the current spreading layer 33. The upper insulation layer 35 has the openings 35b that expose the reflective electrodes 30. In addition, the upper insulation layer 35 may have the openings 35a that expose the current spreading layer 33. The upper insulation layer 35 may cover the sidewalls of the openings 33a of the current spreading layer 33.

The first pad 37a may be disposed on the current spreading layer 33 and, for example, may be connected to the current spreading layer 33 through the opening 35a of the upper insulation layer 35. The second pad 37b is connected to the reflective electrodes 30 exposed through the openings 35b.

According to the exemplary embodiments, the current spreading layer 33 covers the mesas M and almost all regions of the first conductive type semiconductor layer between the mesas M. Thus, the current spreading layer 33 may allow easy dispersion of current therethrough.

In addition, the current spreading layer 23 includes a reflective metal layer, such as Al, and the lower insulation layer is formed of, or includes an insulation reflective layer, so that the current spreading layer 23 or the lower insulation layer 31 can reflect light that is not reflected by the reflective electrodes 30, thereby enhancing light extraction efficiency.

Although the light emitting diode 100 illustrated above may be used in the disclosed technology, the present invention is not limited thereto.

Referring to FIG. 1 again, a mask pattern 120 is formed on a substrate 21. Accordingly, an upper surface of the substrate 21 is partially exposed through openings 121 of the mask pattern 120. The mask pattern may include a photoresist.

The substrate 21 may include a chamfered surface 211 formed at an upper corner thereof. The chamfered surface 211 may be formed by scribing during division of the substrate 21, without being limited thereto. Alternatively, the chamfered surface 211 may be formed by a separate etching process.

Figure 2:
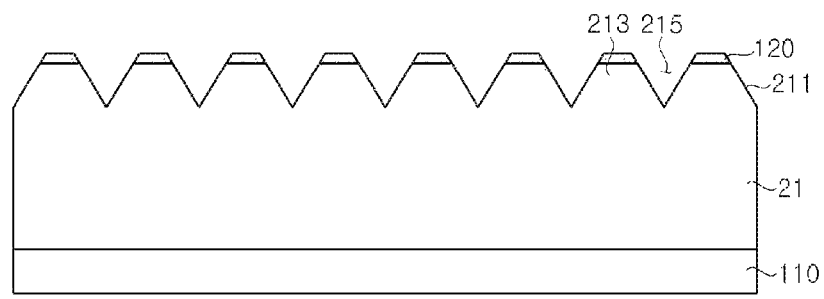

Then, referring to FIG. 2, a convex-concave pattern having protrusions 215 and depressions 213 is formed on an upper surface of the substrate 21.

The convex-concave pattern may be formed by etching using the mask pattern 120 as an etching mask, for example, by dry etching. As a result, the upper surface of the substrate 21 under the openings 121 may be etched to form the depressions 215. The depressions 215 may be formed in various shapes depending upon the shape of the mask pattern 120. For example, the depressions may have a V-shape having inclined side surfaces, as shown in FIG. 2.

In above description, the convex-concave pattern is illustrated as being formed by a separate etching process. However, the convex-concave pattern may alternatively be formed simultaneously with division of the substrate 21 for formation of the light emitting diodes 100. Specifically, when the substrate 21 is divided by laser scribing, a laser beam is also applied to the upper surface of the substrate 21 in regions of the respective light emitting diodes 100, in addition to regions where the substrate 21 is divided. As a result, the depressions 215 may be formed in the regions to which a laser beam is applied. The depressions 215 formed in the process of dividing the substrate 21 may have a V-shape, and the side surfaces of the depressions may have the same inclination as that of the chamfered surface 211. Since the depressions 215 of the convex-concave pattern are formed during division of the substrate into the light emitting diodes 100, etching for forming the convex-concave pattern can be omitted, thereby simplifying the fabrication process.

Figure 3:
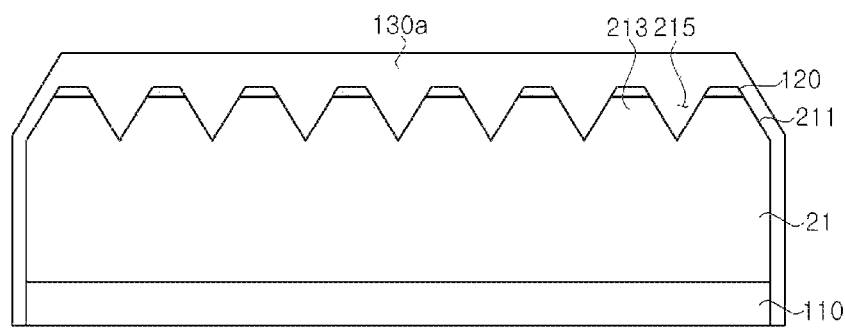
Figure 4:
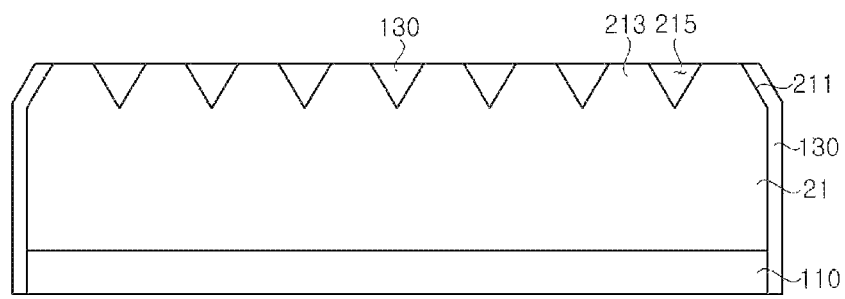

Referring to FIGS. 3 and 4, an anti-reflection layer 130 is formed to cover side surfaces of the substrate 21 and side surfaces of the light emitting structure 110, and to fill the depressions 215.

First, referring to FIG. 3, an anti-reflection material 130a is formed to cover an upper surface and side surfaces of the substrate 21, side surfaces of the light emitting structure 110, and the mask pattern 120.

The anti-reflection material 130a may have an index of refraction n that is lower than that of the substrate 21 and higher than that of air ($n_{air}=1$). By way of example, the anti-reflection material 130a may include $SiO_2$ ($nSiO_2$=about 1.45), and further include at least one of $SiO_2$, $SiN_x$, SiON, $MgF_2$, MgO, $Si_3N_4$, $Al_2O_3$, SiO, $TiO_2$, $Ta_2O_5$, ZnS, CeO and $CeO_2$. The anti-reflection material 130a may be formed by various deposition methods, in particular, by planetary electron beam evaporation. By virtue of planetary electron beam evaporation, the anti-reflection material 130a can be easily formed on the side surfaces of the substrate 21 and the light emitting structure 110.

Then, referring to FIG. 4, the anti-reflection layer 130 is formed by a lift-off process which removes the mask pattern 120 such that the anti-reflection material 130a on the mask pattern 120 is removed. As a result, the light emitting device as shown FIG. 4 is provided.

Although not shown, the light emitting device may further include electrodes formed on a lower surface of the light emitting structure 110.

The anti-reflection layer 130 may cover the side surfaces of the light emitting structure 110 and the substrate 21, and fill the depressions 215. An upper surface of the protrusions 213 may be exposed. With this configuration of the anti-reflection layer 130, the light emitting device can have a wide beam angle, which will be described in more detail hereinafter.

The anti-reflection layer 130 may have an index of refraction which is lower than that of the substrate 21 and higher than that of air, thereby preventing total internal reflection of the light emitting device. By way of example, if the substrate 21 is a sapphire substrate ($n_{sapphire}$=about 1.77), light passing through the anti-reflection layer 130 has a larger critical angle of total reflection than light emitted from the sapphire substrate directly into air.

Thus, the percentage of light emitted to a side surface of the light emitting device is increased, thereby providing a wide beam angle. Further, since the anti-reflection layer 130 is formed only in the depressions 215 on the upper surface of the substrate 21, light directed towards the upper surface of the protrusions is more likely to be subjected to total reflection into the light emitting device such that the light is emitted to the side surface. In addition, since the depressions 215 have inclined side surfaces, light emitted from the light emitting device is more likely to be directed towards the side surface than in a vertical upward direction. Thus, the light emitting device according to the present exemplary embodiment can have a wide beam angle while emitting uniform light over an entire output angle of light. In other words, illumination intensity can be maintained substantially constant regardless of an output angle of light.

According to this exemplary embodiment, the light emitting device can have a wide beam angle while emitting uniform light regardless of an output angle of light without an additional component. In particular, in the case of manufacturing UV light emitting devices, to which lenses, which can be deformed or degraded by UV light, cannot be applied, the light emitting device alone can achieve a wide beam angle, thereby providing improved reliability.

Figure 5:
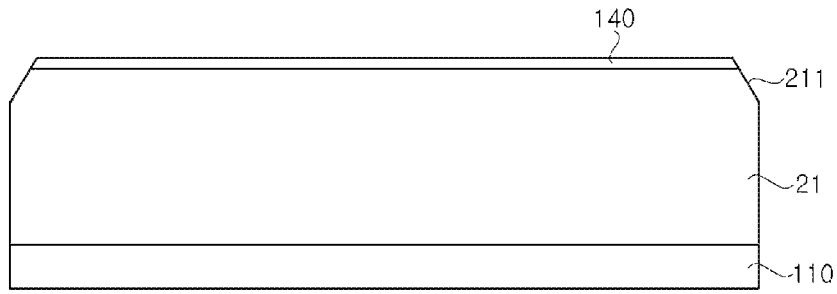
FIGS. 5, 6, and 7 are sectional views of an example of a light emitting device according to another exemplary embodiment of the present invention, and a method of fabricating the same.
Figure 6:
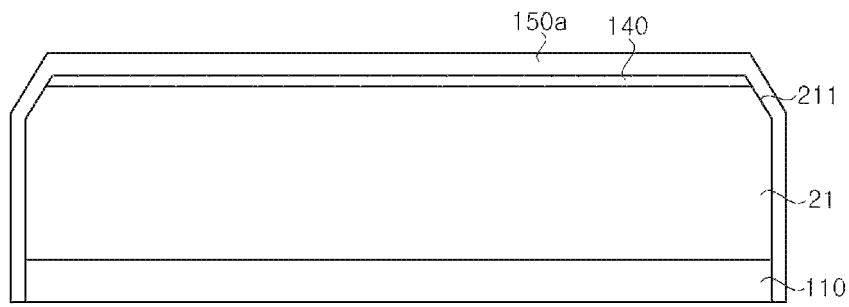
Figure 7:
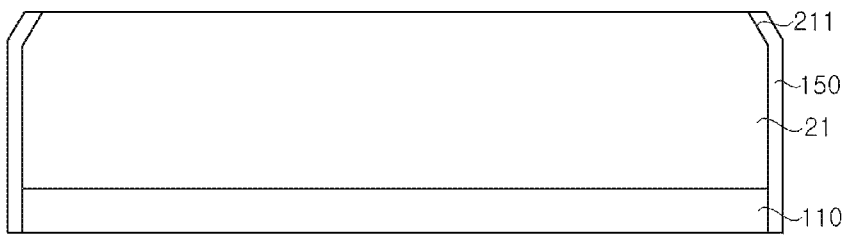

FIGS. 5 to 7 are sectional views of a light emitting device according to another exemplary embodiment, and a method of fabricating the same. The same features as those described in the previously-described exemplary embodiments will not be described in detail here.

Referring to FIG. 5, a mask 140 is formed on a light emitting diode 100. The light emitting diode 100 includes a light emitting structure 110 on which a substrate 21 is formed.

The mask 140 may be formed to cover an upper surface of the substrate 21 and include a photo-resist. A chamfered surface 211 may be exposed without being covered by the mask 140.

Referring to FIG. 6, an anti-reflection material 150a is formed to cover the mask 140, side surfaces of the substrate 21, and side surfaces of the light emitting structure 110. The anti-reflection material 150a may include at least one of $SiO_2$, $SiN_x$, SiON, $MgF_2$, MgO, $Si_3N_4$, $Al_2O_3$, SiO, $TiO_2$, $Ta_2O_5$, ZnS, CeO and $CeO_2$, and be formed by planetary electron beam evaporation.

Referring to FIG. 7, the mask 140 and the anti-reflection material 150a on the mask 140 are removed. As a result, the light emitting device as shown FIG. 7 is provided.

The light emitting device includes the light emitting structure 110, the substrate 21 disposed on the light emitting structure 110, and the anti-reflection layer 150 covering the side surfaces of the light emitting structure 110 and the substrate 21, wherein the upper surface of the substrate 21 is exposed.

Accordingly, total reflection of light directed towards a side surface of the light emitting device is decreased, whereby the amount of light emitted towards the side surface of the light emitting device can be increased. Further, since the light is more likely to be subjected to total reflection at an interface between the upper surface of the substrate 21 and air rather than at the side surface of the light emitting device, a much greater percentage of light can be emitted to the side surface. As a result, a beam angle of the light emitting device can be widened while maintaining substantially uniform illumination intensity over an entire output angle of light.

Figure 9:
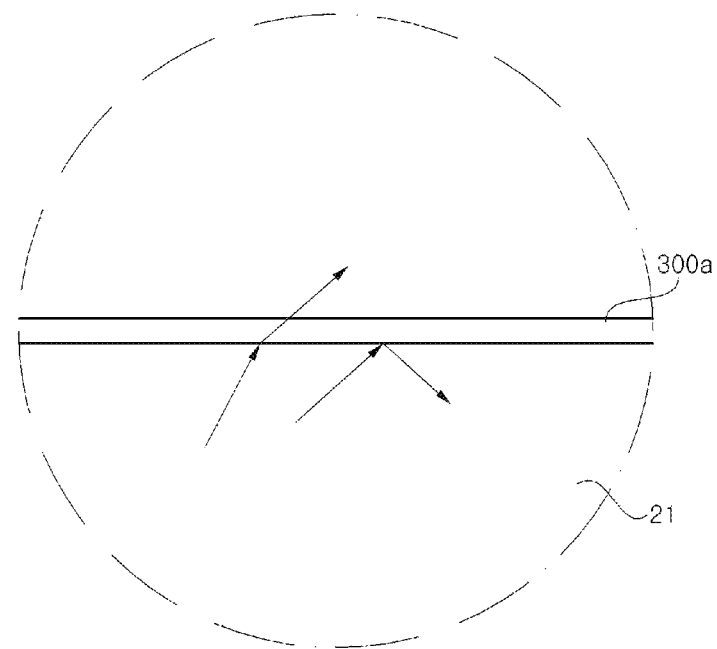
FIGS. 9, 10, and 11 are enlarged sectional views of Region A of FIG. 8 for illustrating a transflective portion according to other exemplary embodiments of the present invention.
Figure 10:
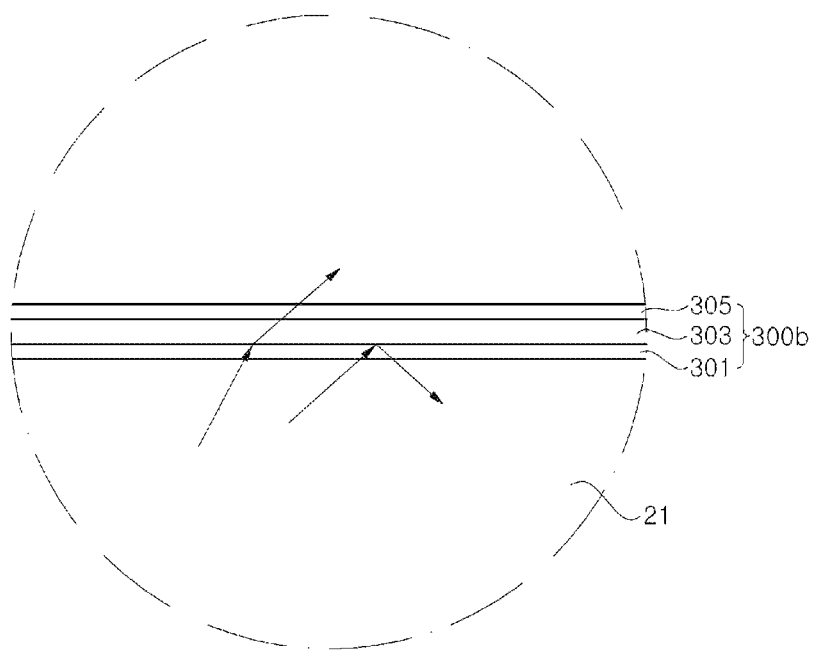
Figure 11:
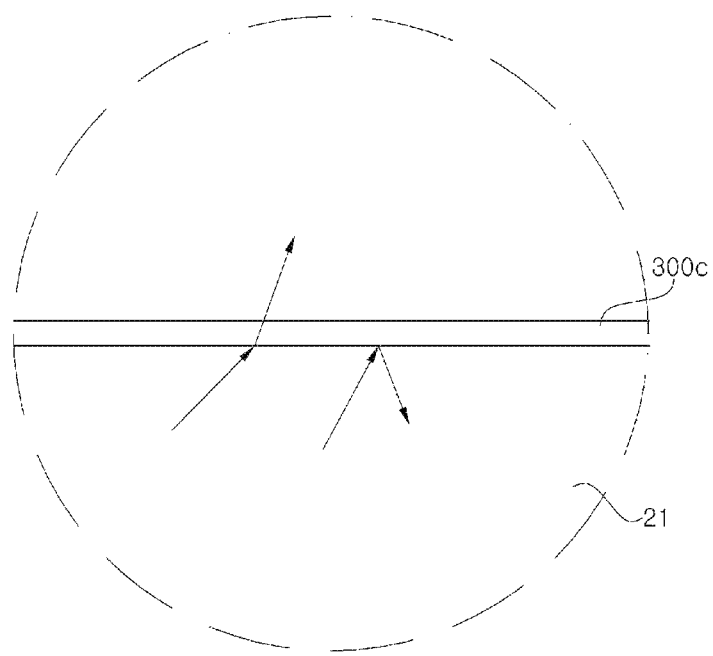

FIG. 8 is a sectional view of a light emitting device according to another embodiment of the disclosed technology, and FIGS. 9 to 11 are enlarged sectional views of a region A in FIG. 8 for illustrating a transflective portion according to another exemplary embodiment of the present invention.

The light emitting device includes a light emitting diode 100 and a transflective portion 300. The light emitting diode 100 includes a substrate 21 and a light emitting structure 110.

The light emitting structure 110 is disposed on one surface of the substrate 21 and the transflective portion 300 is disposed on the other surface of the substrate 21.

The light emitting diode 100 is a flip-chip type light emitting diode and the light emitting device in this exemplary embodiment may include the light emitting diode 100 described with reference to FIGS. 12(a) to 16(b), similar to exemplary embodiments in FIGS. 1 to 4. Thus, the light emitting device may include electrode pads 37a, 37b disposed under the light emitting diode 100. The substrate 21 may be a growth substrate for growth of semiconductor layers, for example, a sapphire substrate or a gallium nitride substrate. By way of example, the substrate 21 is a heterogeneous substrate suitable for growth of gallium nitride semiconductor layers, and has a first index of refraction. For example, the substrate 21 may be a sapphire substrate having an index of refraction of about 1.78 at a wavelength of 450 nm, or a SiC substrate having an index of refraction of about 2.72 at a wavelength of 450 nm. In the disclosed exemplary embodiments, the substrate 21 is a sapphire substrate. The substrate 21 has a thickness of 250 μm or less.

Detailed descriptions of features of the light emitting diode 100 are omitted.

The transflective portion 300 may be disposed on the substrate 21 and may have a different index of refraction from that of the substrate 21. Hereinafter, the transflective portion 300 according to exemplary embodiments will be described in more detail with reference to FIGS. 9 to 11.

Referring to FIG. 9, the transflective portion 300a may have a lower index of refraction than that of the substrate 21. For example, when the substrate 21 is a sapphire substrate, the transflective portion 300a may have an index of refraction of less than 1.78. Since the transflective portion 300a has a lower index of refraction than that of the substrate 21, a light beam angle of the light emitting device is widened by light which is totally reflected at an interface between the transflective portion 300a and the substrate 21. Although the transflective portion 300a is described as having a lower index of refraction than that of the substrate 21, it should be understood that the transflective portion may have a higher index of refraction than that of the substrate 21.

FIG. 10 is a view showing a region A in FIG. 8 according to another exemplary embodiment.

As shown in FIG. 10, the transflective portion 300b is composed of at least two layers. By way of example, the transflective portion 300b includes first to third layers 301 to 305. The first to third layers 301 to 305 are formed of, or include different materials of SiN, $SiO_2$, $TiO_2$, $HfO_2$, and the like.

The first to third layers 301 to 305 have different indexes of refraction. For example, the first layer 301 has a lower index of refraction than that of the second layer 303 disposed on the first layer 301, and the third layer 305 disposed on the second layer 303 has a lower index of refraction than that of the second layer 303. In addition, the first layer may have a lower index of refraction than that of the third layer 305, without being limited thereto. By way of example, the first layer 301 may be formed of, or include $SiO_2$, the second layer 303 may be formed of, or include $TiO_2$, and the third layer 305 may be formed of, or include $HfO_2$.

Alternatively, the indexes of refraction of the first to third layers may decrease with increasing distance from the substrate 21. For example, the first layer 301 may be formed of, or include $TiO_2$, the second layer 303 may be formed of, or include $HfO_2$, and the third layer 305 may be formed of, or include $SiO_2$.

Alternatively, the indexes of refraction of the first to third layers may increase with increasing distance from the substrate 21.

The light emitting device according to another exemplary embodiment can reflect a portion of light entering the light emitting device through the substrate 21 from a semiconductor laminate structure and transmit the other portion of the light by the transflective portion 300b composed of at least two layers, thereby increasing a light beam angle.

Further, the light emitting device may employ a thin substrate 21 having a thickness of 250 μm or less, thereby minimizing light loss while allowing slimness of the light emitting device.

In addition, the light emitting device chip is mounted directly on a circuit board by flip bonding or SMT (Surface Mount Technology), which has an advantage over typical package type light emitting devices in terms of efficiency and reduction in size.

FIG. 11 is a view showing Region A in FIG. 8 according to yet another exemplary embodiment of the present invention.

The transflective portion 300c has a different index of refraction from that of the substrate 21. The transflective portion 300c transmits some of light and reflects the other of light. The transflective portion 300c may be formed of, or include a metallic material. Light transmittance of the transflective portion 300c may be controlled by adjusting the thickness thereof. The transflective portion 300c is composed of a thin metal film layer.

The light emitting device according to yet another exemplary embodiment can reflect some of light entering the light emitting device through the substrate 21 from a semiconductor laminate structure and transmit the other of the light by virtue of the transflective portion 300c composed of a thin metal film layer, thereby increasing a light beam angle.

Further, the disclosed technology employs a thin substrate 21 having a thickness of 250 μm or less, thereby minimizing light loss while allowing slimness of the light emitting device.

In addition, the light emitting device chip is mounted directly on a circuit board by flip bonding or SMT (Surface Mount Technology), which has an advantage over a typical package type light emitting devices in terms of efficiency and reduction in size.

Implementations of the disclosed technology can be used to provide a light emitting device which includes an anti-reflection layer and a substrate, an upper surface of which is at least partially exposed, as well as a method of fabricating the same. Thus, a beam angle of the light emitting device can be widened. Further, a light emitting device which emits a substantially constant amount of light regardless of an output angle of light can be provided. Therefore The light emitting device having a wide beam angle can be provided without additional components. Thus, reliability of the light emitting device can be improved.

Further, implementations of the disclosed technology can be used to provide the light emitting device further including a light emitting structure disposed on one surface of a substrate and a transflective portion disposed on the other surface of the substrate, wherein the transflective portion has a different index of refraction from that of the substrate to reflect a portion of light emitted to the other surface of the substrate, thereby widening a light beam angle. The light emitting device employs a thin substrate having a thickness of 250 μm or less while achieving a light beam angle of 140° or more, thereby minimizing light loss and having an advantage with respect to reduction in thickness thereof. Further, according to the present invention, a light emitting device chip is mounted directly on a circuit board by flip bonding or SMT (Surface Mount Technology), which has an advantage over a typical package type light emitting device in terms of high efficiency and reduction in size.

Various modifications and variations can be made to the exemplary embodiments without departing from the spirit and scope of the appended claims of the present invention, and the present invention incorporates all of the spirit and scope of the appended claims.

What is claimed is:

1. A light emitting device comprising:
a substrate;
a light emitting structure disposed on one surface of the substrate; and
a transflective portion disposed on the other surface of the substrate,
wherein the transflective portion and the substrate have different indexes of refraction from one another.

2. The light emitting device of claim 1, wherein the transflective portion comprises a plurality of layers having different indexes of refraction from one another.

3. The light emitting device of claim 2, wherein the layers comprise different layers comprising at least two of SiN, $SiO_2$, $TiO_2$, and $HfO_2$.

4. The light emitting device of claim 3, wherein the layers comprise first to third layers, each of the first to third layers comprising any one of SiN, $SiO_2$, $TiO_2$ and $HfO_2$, and the first to third layers comprise different materials from one another.

5. The light emitting device of claim 2, wherein the layers comprise first to third layers sequentially stacked one above another, the first layer has a lower index of refraction than that of the second layer disposed on the first layer, and the third layer disposed on the second layer has a lower index of refraction than that of the second layer.

6. The light emitting device of claim 2, wherein the layers comprise first to third layers sequentially stacked one above another, and the index of refraction is decreased from the first layer to the third layer.

7. The light emitting device of claim 2, wherein the layers comprise first to third layers sequentially stacked one above another, and the index of refraction is increased from the first layer to the third layer.

8. The light emitting device of claim 1, wherein the transflective portion comprises a thin metal film layer.

9. The light emitting device of claim 1, wherein the substrate has a thickness of 250 μm or less.

* * * * *